US011121224B2

(12) United States Patent
Chuang et al.

(10) Patent No.: US 11,121,224 B2
(45) Date of Patent: Sep. 14, 2021

(54) TRANSISTOR WITH FIELD PLATE OVER TAPERED TRENCH ISOLATION

(71) Applicant: Texas Instruments Incorporated, Dallas, TX (US)

(72) Inventors: Ming-Yeh Chuang, McKinney, TX (US); Elizabeth Costner Stewart, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 37 days.

(21) Appl. No.: 16/270,729

(22) Filed: Feb. 8, 2019

(65) Prior Publication Data

US 2020/0258987 A1    Aug. 13, 2020

(51) Int. Cl.
| | |
|---|---|
| *H01L 29/40* | (2006.01) |
| *H01L 29/78* | (2006.01) |
| *H01L 21/308* | (2006.01) |
| *H01L 29/66* | (2006.01) |
| *H01L 29/06* | (2006.01) |

(52) U.S. Cl.
CPC .......... *H01L 29/402* (2013.01); *H01L 21/308* (2013.01); *H01L 29/0649* (2013.01); *H01L 29/66681* (2013.01); *H01L 29/66893* (2013.01); *H01L 29/7816* (2013.01)

(58) Field of Classification Search
CPC . H01L 21/308; H01L 29/402; H01L 29/7816; H01L 29/66681; H01L 29/66893; H01L 29/0649
See application file for complete search history.

(56) References Cited

U.S. PATENT DOCUMENTS

| | | | | |
|---|---|---|---|---|
| 6,007,968 A | * | 12/1999 | Furukawa | G03F 7/038 257/E21.027 |
| 6,204,537 B1 | * | 3/2001 | Ma | H01L 27/0251 257/355 |
| 6,548,874 B1 | * | 4/2003 | Morton | H01L 27/092 257/344 |
| 6,878,603 B2 | * | 4/2005 | Bromberger | H01L 29/0653 438/390 |

(Continued)

OTHER PUBLICATIONS

Elizabeth C. Stewart et al., "Method of Fabricating a Thick Oxide Feature on a Semiconductor Wafer", U.S. Appl. No. 15/850,999, filed Dec. 21, 2017, Texas Instruments Incorporated, U.S.A.

*Primary Examiner* — Eugene Lee
(74) *Attorney, Agent, or Firm* — Jacqueline J. Garner; Charles A. Brill; Frank D. Cimino

(57) ABSTRACT

An integrated circuit (IC) includes a field-plated transistor including a substrate having a semiconductor surface layer, at least one body region in the semiconductor surface layer, and at least a first trench isolation region adjacent to the body region having at least a first tapered sidewall that has an average angle along its full length of 15 to 70 degrees. A gate is over the body region. A field plate is over the first tapered trench isolation region. A source is on one side of the field plate and a drain is on an opposite side of the field plate. The IC also includes circuitry for realizing at least one circuit function having a plurality of transistors which are configured together with the field-plated transistor that utilize second trench isolation regions for isolation that have an average angle of 75 and 90 degrees.

15 Claims, 7 Drawing Sheets

(56) References Cited

U.S. PATENT DOCUMENTS

| | | | |
|---|---|---|---|
| 7,348,256 B2* | 3/2008 | Miller, Jr. | H01L 21/823481 |
| | | | 438/435 |
| 8,969,997 B2* | 3/2015 | Tsao | H01L 31/04 |
| | | | 257/499 |
| 9,018,691 B2* | 4/2015 | Chen | H01L 27/11524 |
| | | | 257/315 |
| 9,660,074 B2 | 5/2017 | Cai | |
| 2006/0001050 A1* | 1/2006 | Wang | H01L 29/4916 |
| | | | 257/213 |
| 2006/0043522 A1* | 3/2006 | Trivedi | H01L 21/76229 |
| | | | 257/506 |
| 2009/0152743 A1* | 6/2009 | Jomaa | H01L 23/49822 |
| | | | 257/782 |
| 2009/0200675 A1* | 8/2009 | Goebel | H01L 24/11 |
| | | | 257/758 |
| 2010/0264486 A1 | 10/2010 | Denison et al. | |
| 2011/0169077 A1* | 7/2011 | Ito | H01L 29/0653 |
| | | | 257/336 |
| 2014/0134757 A1* | 5/2014 | Huang | H01L 21/0274 |
| | | | 438/7 |
| 2015/0221524 A1 | 8/2015 | Stewart et al. | |
| 2017/0110409 A1* | 4/2017 | Kuo | H01L 23/544 |
| 2019/0103419 A1* | 4/2019 | Wang | H01L 29/78633 |
| 2019/0391127 A1* | 12/2019 | Braeken | G01N 33/4836 |

* cited by examiner

TRANSISTOR WITH FIELD PLATE OVER TAPERED TRENCH ISOLATION

FIELD

This Disclosure relates to field effect transistors having field plates.

BACKGROUND

Field plates are used in high power or high voltage metal oxide semiconductor field effect transistor (MOSFET) devices for during operation to smooth the electric field and thus reduce impact ionization (II). As a result, the device performance (e.g., breakdown voltage (BV), reliability, etc.) can be enhanced. Local Oxidation of Silicon (LOCOS) is a generally preferred dielectric isolation structure for use under the field plates as compared to shallow trench isolation (STI) because STI has sharper corners that result in a higher electric field and thus degraded device performance.

Advanced technology nodes that form integrated circuits (ICs) which include digital complementary MOS (CMOS) circuitry such as mixed signal ICs (e.g., an Analog-to-Digital Converter (ADC) or a Digital-to-Analog Converter (DAC)), generally use STI for providing higher circuit density. For example, conventionally one mask and additional processing are needed to create the LOCOS oxide under the field plates for laterally diffused MOSFET (LDMOS) devices in a STI isolated technology.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure includes a grayscale photolithography-based method of forming trench isolation described as being shallow trench isolation (STI) that has at least one tapered sidewall. Disclosed aspects include a method of fabricating a field-plated transistor that comprises forming at least one body region in a semiconductor surface layer on a substrate, and using a mask or a reticle having a grayscale pattern to form a patterned masking layer that includes at least one feature on the semiconductor surface layer adjacent to the body region that has a tapered sidewall. The patterned masking layer on the semiconductor surface layer is etched to form at least one trench in the semiconductor surface layer having at least one tapered trench sidewall. The trench is filled with at least one dielectric material, which is then planarized to form a first trench isolation region having at least a first tapered sidewall that has an average angle along its full length of 15 to 70 degrees. A field plate (e.g., a portion of a gate electrode for a MOS transistor) is formed including over at least a portion of the first tapered sidewall. A source is formed on one side of the field plate and a drain is formed on an opposite side of the field plate.

BRIEF DESCRIPTION OF THE DRAWINGS

Reference will now be made to the accompanying drawings, which are not necessarily drawn to scale, wherein.

DETAILED DESCRIPTION

Figure 1A:
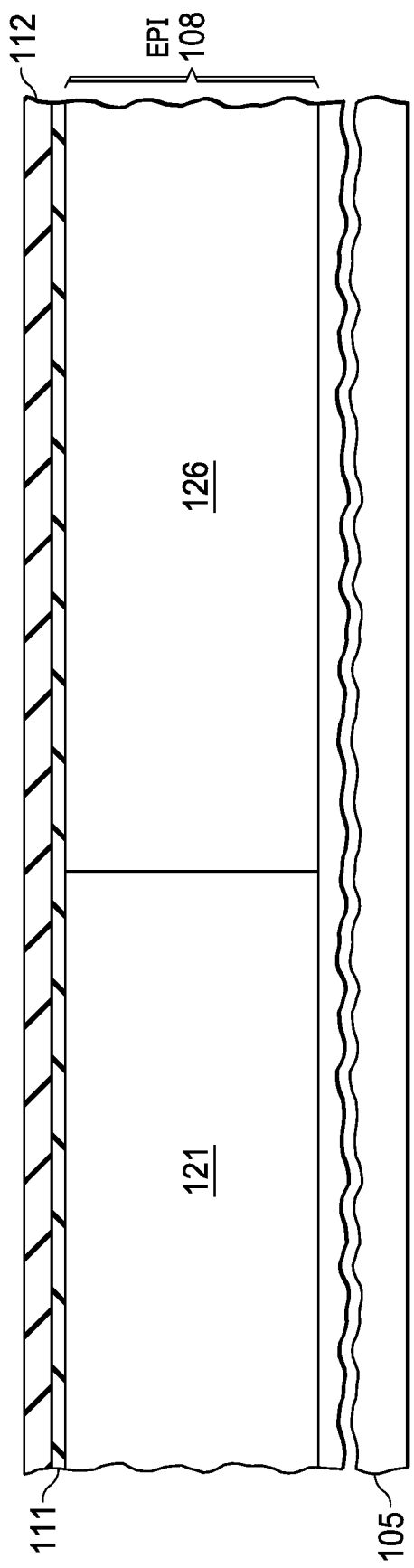
FIGS. 1A-E show successive cross sectional views associated with a steps in a disclosed fabrication method that includes grayscale photolithography-based trench isolation formation for fabricating a field-plated transistor having disclosed trench isolation (e.g., STI) with a disclosed tapered sidewall having average angle along its full length of 15 to 70 degrees, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

This Disclosure recognizes STI with a tapered STI sidewall can create a field plate structure for a field-plated transistor that enhances field-plated transistor performance analogous to the performance enhancement provided when using a LOCOS oxide. Due to the controllability of the angle(s) (or slope(s)) of tapered sidewall of the trench isolation the field-plated transistor performance may be improved as compared to a LOCOS oxide depending on the angle of the tapered edge and how smooth the resulting electric field during transistor operation is. Conventional STI is also known as a box isolation technique due to the STI sidewalls having a sidewall angle (relative to the bottom portion of the STI region) of generally between 75 and 90 degrees, typically between 80 and 90 degrees, thus having essentially vertical STI sidewalls. Disclosed STI with a tapered STI sidewall(s) also enables an IC including both CMOS digital circuitry and field-plated transistors to avoid the need to provide STI isolation for enabling high circuit density for the digital circuitry as well as a separate LOCOS oxide for providing the LOCOS oxide with its characteristic sloped sidewall for the field-plated transistors.

The STI sidewall thickness profile and thus its angle can be tapered locally with a grayscale photolithography process which utilizes a mask or a reticle having a grayscale pattern. Grayscale photolithography uses diffraction phenomena during the exposure to modulate the intensity of the exposure light transmitted therethrough which is typically ultraviolet (UV) light that is collected by the lithography tool's objective lens. Diffraction is known in physics to comprise the bending, spreading and interference of waves when they pass by an obstruction or through a gap (e.g. a slit). In grayscale photolithography, the basic concept in creating sloped (gradient) height structures on a photoresist (PR) layer is that grayscale lithography changes the exposure dose locally to develop a 3D structure in the PR layer.

A differential exposure dose makes a differential depth of exposed PR layer across the substrate surface because the photoactive compound in the PR layer is absorbing the light (e.g., the UV light) energy as it travels in the depth of the PR layer. For example, by using a chrome-on-glass (COG) mask or reticle that is sized with features which may be referred to as pixels (see the pixels 161, 162, 163 and 164 shown in FIG. 1B described below) having an appropriate size and/or pitch to induce diffraction of the ultraviolet light, the ultraviolet light intensity that is transmitted can be locally modulated. Diffraction occurs in projection lithography using a COG mask or reticle patterned with opaque pixels when both the size and the pitch of the pixels are close to or below the resolution of the lithography system being utilized.

For an IC, a tapered STI sidewall with an average angle along its full length of 15 to 70 degrees is selectively (i.e., locally) created under where there are to be a transistor's (e.g., MOSFET) field plates, which for MOS transistors is generally under a portion of the transistor's gate because under the gate is typically the most effective layer to implement field plating effects. However, other electrical conductive layers, e.g. thin film TiN, can also benefit from field plating over disclosed STI isolation having a tapered sidewall. For example, a thin film such as TiN may be on top of gate polysilicon and extend outside the gate polysilicon so that the thin film layer can provide a field-plating effect. This arrangement is similar to Metal-1 field plating, but can be a shorter distance to the substrate (e.g., silicon) surface and therefore can be more effective.

The field-plated transistor can comprise a JFET (see FIG. 3 described below) or a MOSFET that uses the reduced angle sidewall to reduce the peak electric field in the semiconductor surface layer, which as a result improves the field-plated transistor's BV and its reliability. A grayscale lithography method using a grayscale mask or reticle can be integrated into an existing STI isolated process technology or a new STI isolated process technology, which enables not having any impact to the standard STI essentially vertical sidewall profile for the non-field-plated devices on the rest of the IC (see the STI 135' with essentially vertical sidewall between the MOS devices 210 and 220 for IC 200 shown in FIG. 2 described below).

Figure 1B:
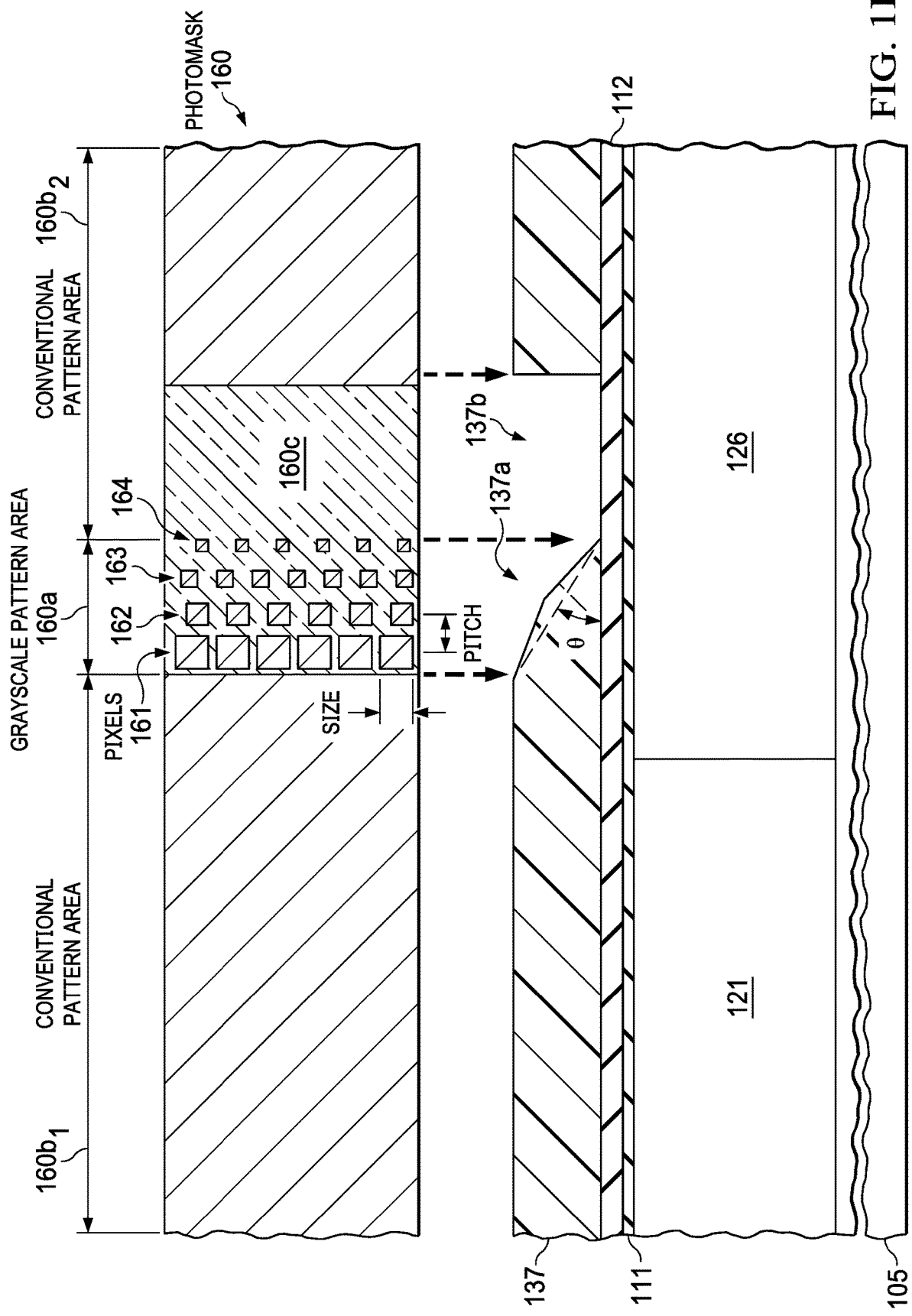
Figure 1C:
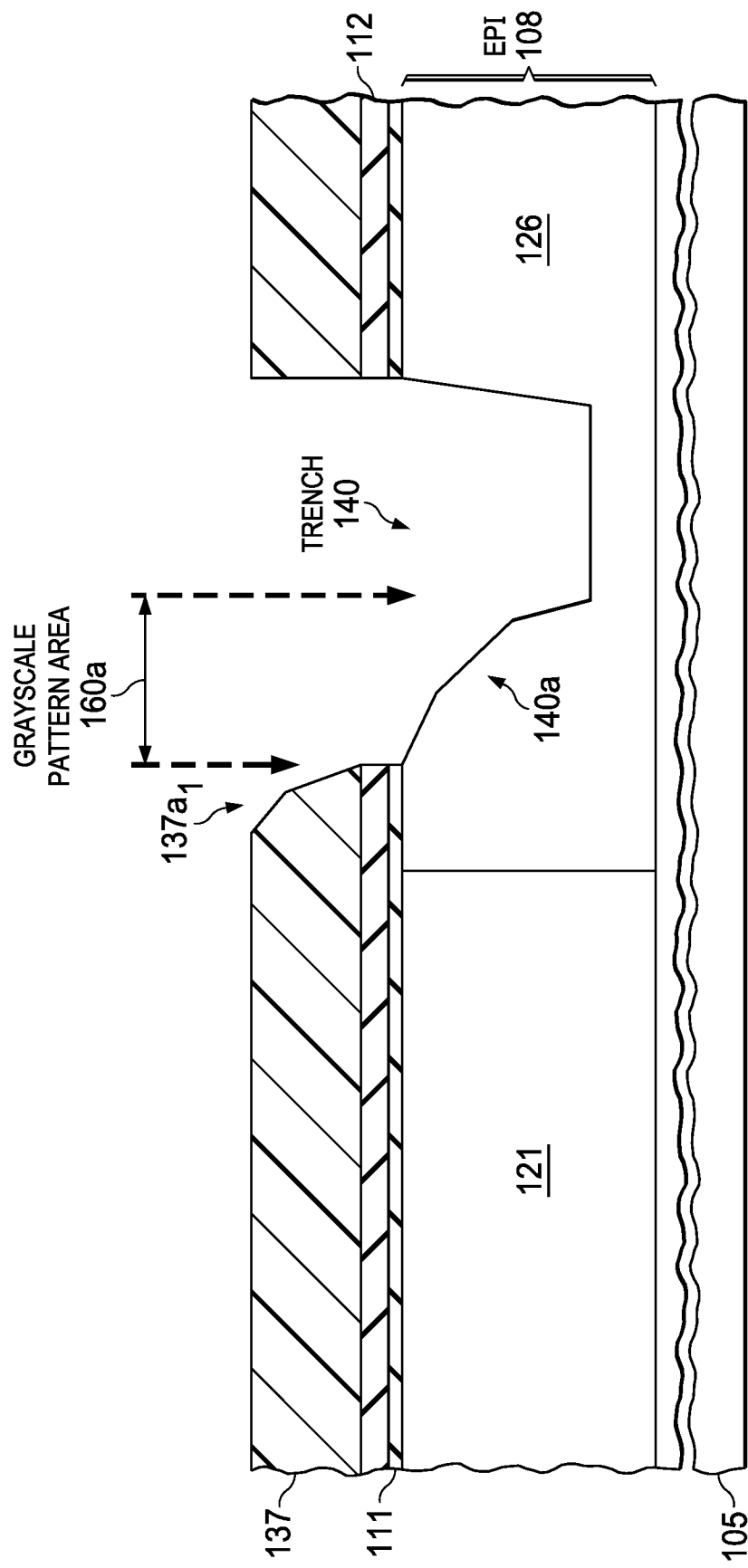
Figure 1D:
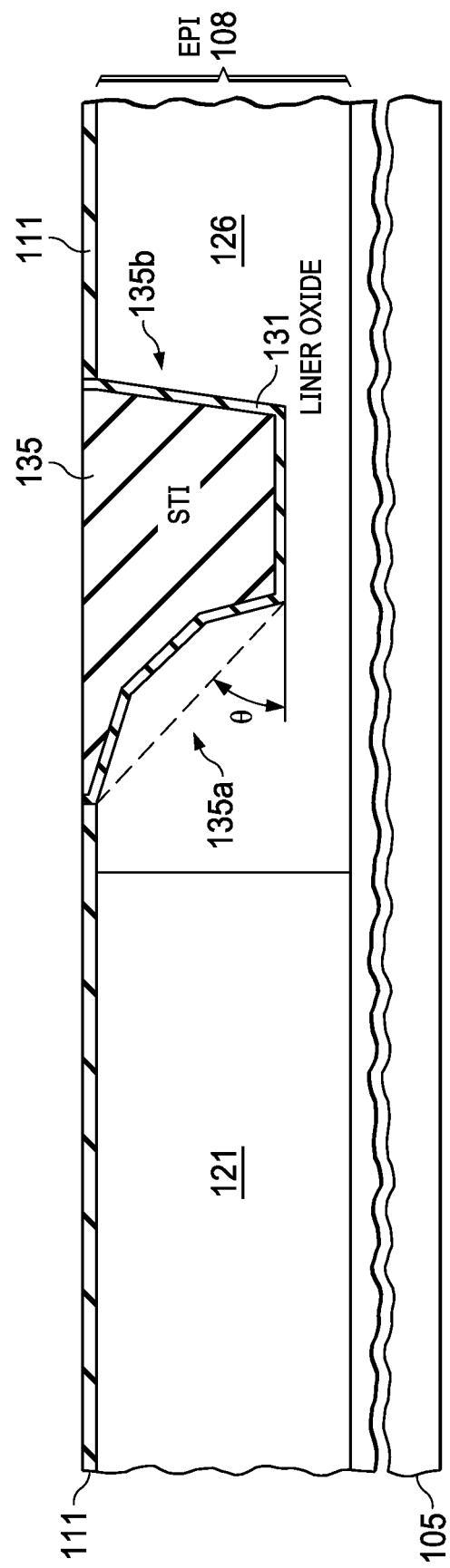
Figure 1E:
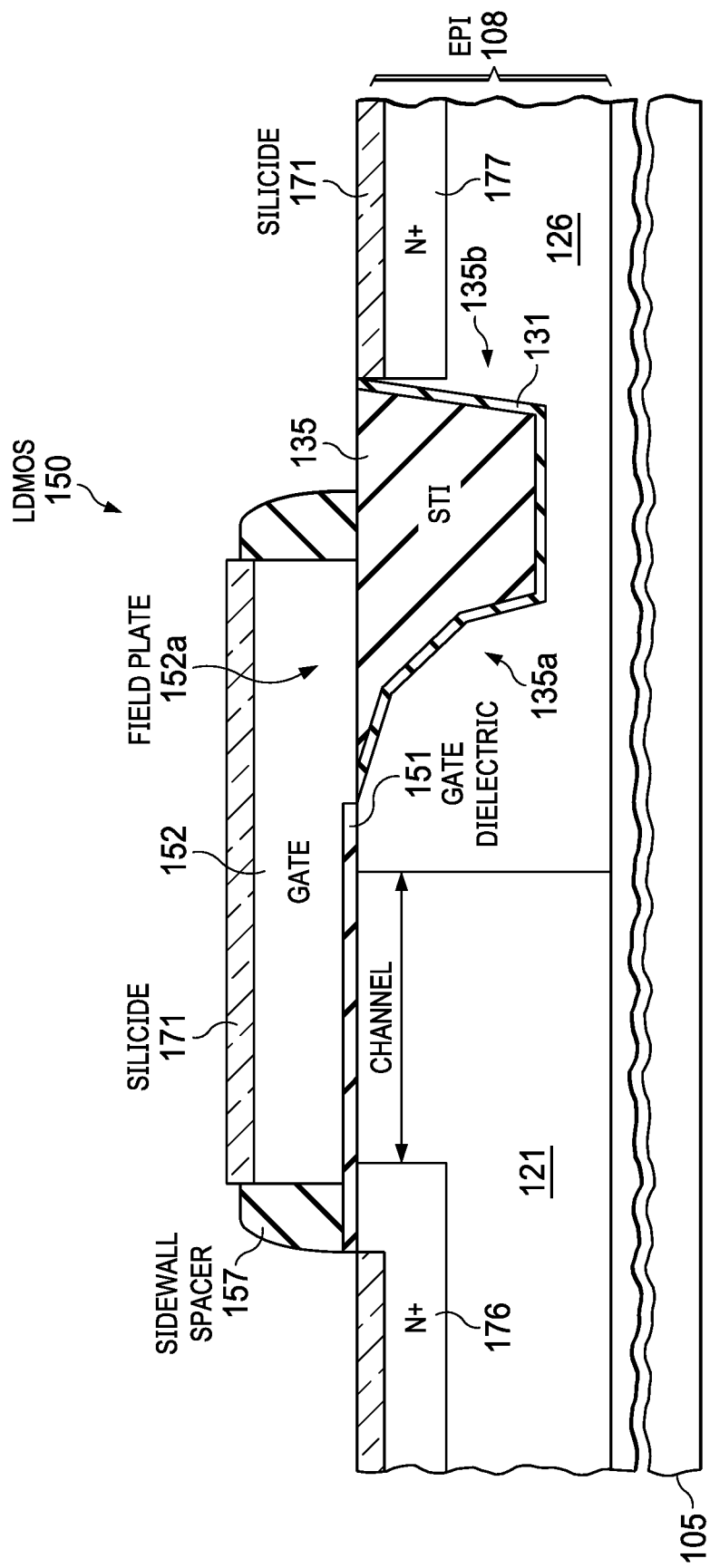

FIGS. 1A-1E show successive cross sectional views associated with a steps in a disclosed fabrication method that includes grayscale photolithography-based trench isolation formation for fabricating a field-plated transistor shown as an LDMOS transistor 150 in FIG. 1E having disclosed trench isolation (e.g., STI 135) having a disclosed tapered sidewall with an average angle along its full length of 15 to 70 degrees. The LDMOS transistor 150 to be formed has a gate 152 with a field plate portion 152a over trench isolation shown as STI 135 having a tapered sidewall 135a. Although NLDMOS transistors are described herein, it is clear to one having ordinary skill in the art to use this information to for PLDMOS transistors, by n-doped regions being substituted by p-doping and vice versa. Although shown as a LDMOS transistor, as described above the field-plated transistor can also comprise a JFET or can comprise another metal oxide semiconductor (MOS) field-plated transistor type, such as an asymmetric drain extended (DE)-CMOS, or symmetric DECMOS (similar to CMOS).

It is recognized that grayscale photolithography can generate a range of PR thicknesses across the respective die on the wafer for a given exposure and development condition, and can also utilize conventional photolithographic tools. A grayscale mask or reticle is used in the grayscale photolithography. Although described herein using a positive PR, the PR may also be a negative PR. As used herein a mask is defined as a tool that contains patterns which can be transferred to an entire wafer or another mask in just a single exposure, and a reticle is defined as a tool that contains a pattern image that needs to be stepped and repeated in order to expose the entire wafer or mask.

FIG. 1A shows an in-process LDMOS transistor or IC having at least one in-process LDMOS transistor after growing a pad oxide 111 on a semiconductor surface layer shown as an epitaxial (epi) layer 108 on a substrate 105 (e.g., a wafer), then depositing a silicon nitride layer (nitride layer) 112 on the pad oxide layer 111. The pad oxide can be 40 A to 500 A thick, and the silicon nitride layer 112 can be 500 A to 3,000 A thick. In one particular example arrangement the substrate 105 is p-type and the epi layer 108 is also p-type, with a lighter doping level in the epi layer 108 as compared to doping level in the substrate 105.

A pbody 121 (or pwell) and an ndrift region 126 (or nwell) are both shown formed in the epi layer 108. The pbody 121 implant can comprise $B^{11}$ at a multiple stepped energy chain of 3 or more implants in the 10 keV to 2,000 keV range with a total dose of about $2\times10^{12}$ to $1\times10^{14}$ $cm^{-2}$. The implant for forming the ndrift region 126 can comprise $P^{31}$ at a dose of about $1\times10^{13}$ $cm^{-2}$ with a chain of multiple energy steps from 10 keV to 3,000 keV.

FIG. 1B shows the in-process LDMOS transistor after a STI photolithography process with a mask or reticle having a grayscale pattern shown as mask for printing a patterned PR layer 137 using a photomask 160 having a grayscale pattern area 160a, and conventional (i.e., solid; non-grayscale/non-pixelated) pattern areas 160b1 and 160b2. Arrows are shown from the photomask 160 extending onto the surface of the area for the LDMOS transistor indicating the formation of the tapered sidewall 137a using the grayscale pattern area 160a and the PR layer aperture 137b using the clear mask region 160c in the conventional pattern areas 160b2. In the grayscale pattern area 160a there are shown opaque square pixels each in columns with different sized pixels including pixels 161 (the largest size pixels) in a first column, pixels 162 (the second largest size) in a second column, pixels 163 (the second smallest size) in a third column, and pixels 164 (the smallest size) in a fourth column. The pitch shown is the center-to-center distance between pixels in adjacent columns.

The light intensity passing through the photomask 160 is dependent on the fill area of each pitch shown in FIG. 1B. For example, if the photomask 160 is designed with square pixels as shown and a set pitch between the pixels, the light intensity passing through the photomask 160 can depend on the percentage of the opaque area for each pitch area, with the light intensity passing through an area of the photomask 160 decreasing as the percentage of the opaque area for each pitch area increases. The pixel density in the grayscale pattern area 160a determines the PR layer exposure and thus the sidewall slope of the PR layer 137, with a higher pixel density resulting in in a lower angle (or slope) of the tapered sidewall 137a. The average angle along the length of the tapered sidewall 137a shown as θ is shown by example as being about 45 degrees, which can be 15 to 70 degrees, such as 20 to 65 degrees, that thus has a lower angle as compared to the conventional 75 to 90 degree angle of the sidewall of a PR layer over an epi or substrate region to become STI.

As known in the art of photolithography, there are several ways by which a pattern may be transferred to a wafer using a mask, a reticle, or a combination of both. Regardless of the pattern transfer process, the starting point is a set of pattern data that is converted into an actual pattern by a 'pattern generator.' Commonly-used pattern generators include plotters, optical pattern generators, and electron beam pattern generators. The patterns generated by the pattern generators are formed on either a mask or reticle. The patterns formed on a reticle can be transferred directly onto the wafer, or they may first go to a mask which is the one that transfers the patterns to the wafer. Patterns on masks generally get transferred to the wafer directly.

The 'polarity' of the mask or reticle can either be positive or negative. A positive mask or reticle has background areas (or fields) that are clear or transparent, which is why a positive mask or reticle is also known a 'clear-field' tool. A negative mask or reticle has fields that are opaque, so that a negative mask or reticle is also known a 'dark-field' tool.

Although the tapered sidewall 137a is shown in FIG. 1B with 2 different slopes the actual number of slopes can be ≥2, or there can be a single slope throughout. As noted above, although the patterned PR layer 137 is shown is a positive PR layer, a negative PR may also be used.

FIG. 1C shows results after an STI etch with the patterned PR layer 137 acting as an etch mask for etching the nitride layer 112, the pad oxide layer 111, the PR layer 137, and the silicon in the epi layer 108 shown extending into the nwell 126 (or ndrift region for NLDMOS). These etches utilize the tapered sidewall 137a for forming the trench 140 shown that has a tapered trench sidewall 140a with a reduced slope as compared to a conventional trench etch, which generally follows the sloped of the tapered sidewall 137a to generate a tapered trench sidewall 140a that has an average angle along its full length of 15 to 70 degrees. However, it is not necessary for the tapered trench sidewall 140a to 1:1 follow the sloped of the tapered sidewall 137a, as the ratio besides 1:1 can be 2:1, 3:1, etc., depending on PR layer 137 and the etch chemical characteristics.

The depth of the trench 140 is generally 200 nm to 900 nm. Generally, one etch is used to etch both the nitride layer 112 and the pad oxide layer 111, while a second etch comprising a silicon etch generally comprising a dry (e.g., plasma) etch generally follows. These etch processes generally also etch some of the PR layer 137. Depending on the etch chemical and selectivity between PR layer 137 and the silicon in the epi layer 108, the nitride layer 112 and the pad oxide layer 111, the angle of the tapered trench sidewall 140a can be somewhat different (e.g., by a few degrees) from the tapered sidewall 137a shown in FIG. 1B. However, the average angle of the tapered trench sidewall 140a will generally also be 15 to 70 degrees.

The grayscale pattern area 160a from the photomask 160 is shown in FIG. 1C providing the tapered trench sidewall 140a. The PR layer 137 is shown having an etched edge 137a1 due to being removed (rescission) in the grayscale pattern area 160a during the nitride layer 112 and the pad oxide layer 111 etch, and is thus shown as a thinner portion of the PR layer 137. The PR layer 137 and the nitride layer 112 are then both removed.

FIG. 1D shows the in-process LDMOS transistor after trench liner oxide 131 formation, where the trench liner oxide 131 is generally a thermal oxide that generally has a thickness in the range of 50 A to 200 A, then an STI fill follows generally comprising a Low-Pressure Chemical Vapor Deposition (LPCVD) or Sub-atmospheric CVD (SACVD) process. Chemical mechanical planarization (CMP) is then generally used to remove the overburden to form the STI region 135 shown that has a tapered sidewall 135a. Although the tapered sidewall 135a may have an average angle somewhat different (e.g., a few degrees) relative to the tapered trench sidewall 140a, the average angle of the tapered sidewall 135a will generally also be 15 to 70 degrees, such as 20 to 65 degrees.

Although outside of the trench(es) 140 some silicon oxide will grow when thermally forming the trench liner oxide 131, for simplicity this is not shown in FIG. 1D. As described above the angle of the tapered sidewall 135a can be controlled locally through the grayscale pattern areas 160a in the mask or reticle pattern. The STI region 135 that has the tapered sidewall 135a shown on the left side of FIG. 1D has an average angle shown as θ that is about 45 degrees due to the grayscale pattern area 160a, and a steeper STI angle being that of conventional STI of 75 to 90 degrees is shown on the right side as the conventional STI sidewall 135b.

FIG. 1E shows the in-process field-plated NLDMOS transistor 150 after forming a gate dielectric 151 (e.g., a gate oxide), then depositing a gate 152 that may comprise polysilicon which includes a field plate portion 152a, forming gate sidewall spacers 157, and then forming a self-aligned n+ source 176 and n+ drain 177 generally by ion implantation. An optional suicide layer 171 is shown over the gate 152, over the source 176, and over the drain 177. The NLDMOS transistor 150 having a disclosed tapered STI sidewall (tapered sidewall) 135a under the field plate 152a can during operation reduce the peak electric field in the adjacent silicon, and thus improve the BV and reliability of the NLDMOS transistor 150 by reducing II effects.

Figure 2:
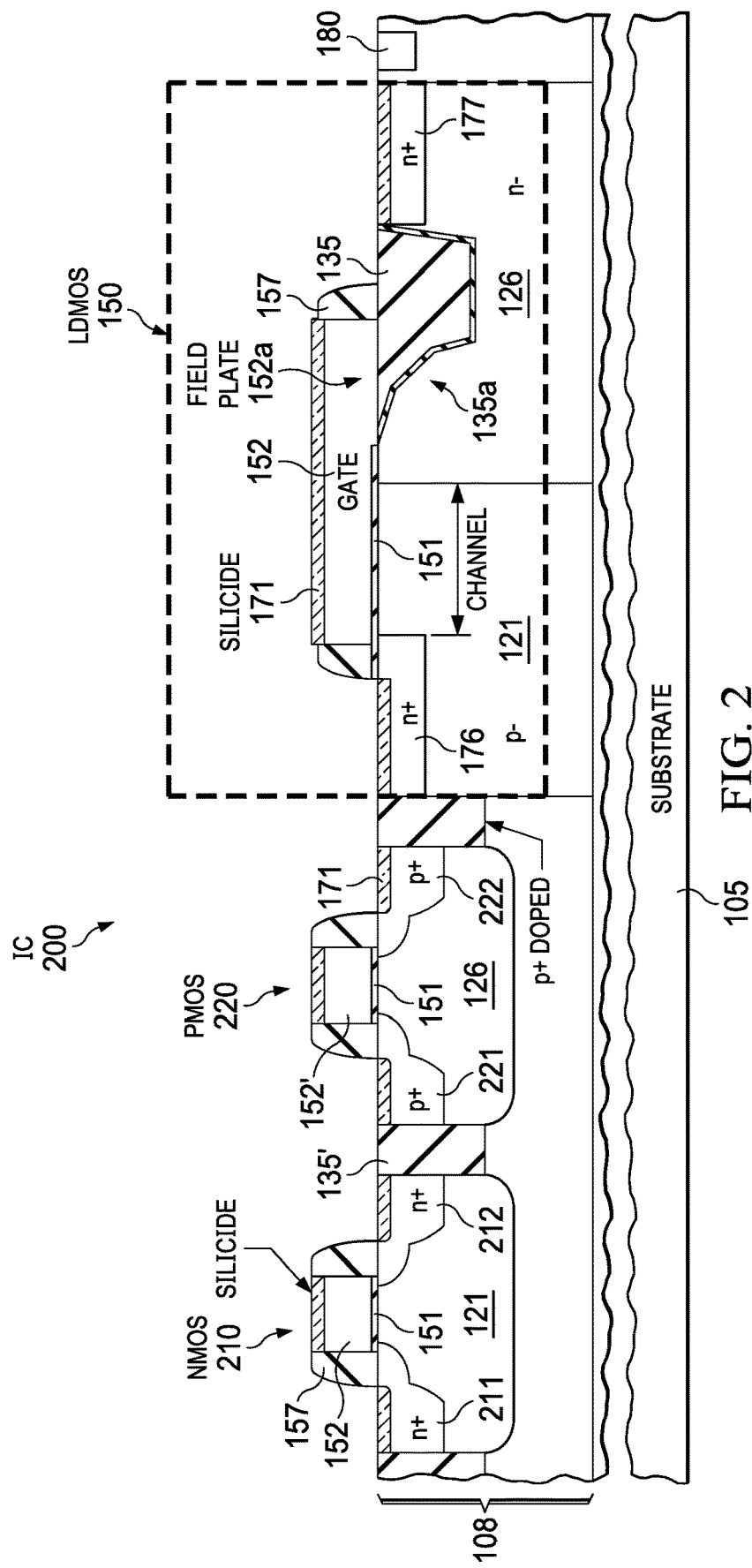
FIG. 2 is a cross sectional view of an example IC including a field-plated LDMOS device having STI with a disclosed tapered sidewall under a portion of the gate, and CMOS circuitry having conventional STI with essentially vertical sidewalls, according to an example aspect.

FIG. 2 is a cross sectional view of an IC 200 including the field-plated NLDMOS device 150 shown in FIG. 1E having an STI region 135 with a tapered sidewall 135a under the field plate 152a over the nwell 126 that functions as a drift region, and CMOS circuitry with a PMOS transistor 220 and an NMOS transistor 210 both shown having conventional STI 135' with a 90 degree sidewall angle that may be referred to as second trench isolation regions, according to an example aspect. The PMOS transistor 220 includes a gate 152 with gate sidewall spacers 157, source 221 and drain 222 each shown including lightly doped drain (LDD) regions, and an NMOS transistor 210 includes a gate 152' with gate sidewall spacers 157, a source 211 and a drain 212 each with an LDD region. The block shown as 180 generally comprises circuit elements (including transistors, and generally diodes, resistors, capacitors, etc.) formed in the semiconductor surface layer configured together with the transistors shown for realizing at least one circuit function such as analog (e.g., an amplifier, power converter or power field effect transistor (FET)), or an RF function.

Figure 3:
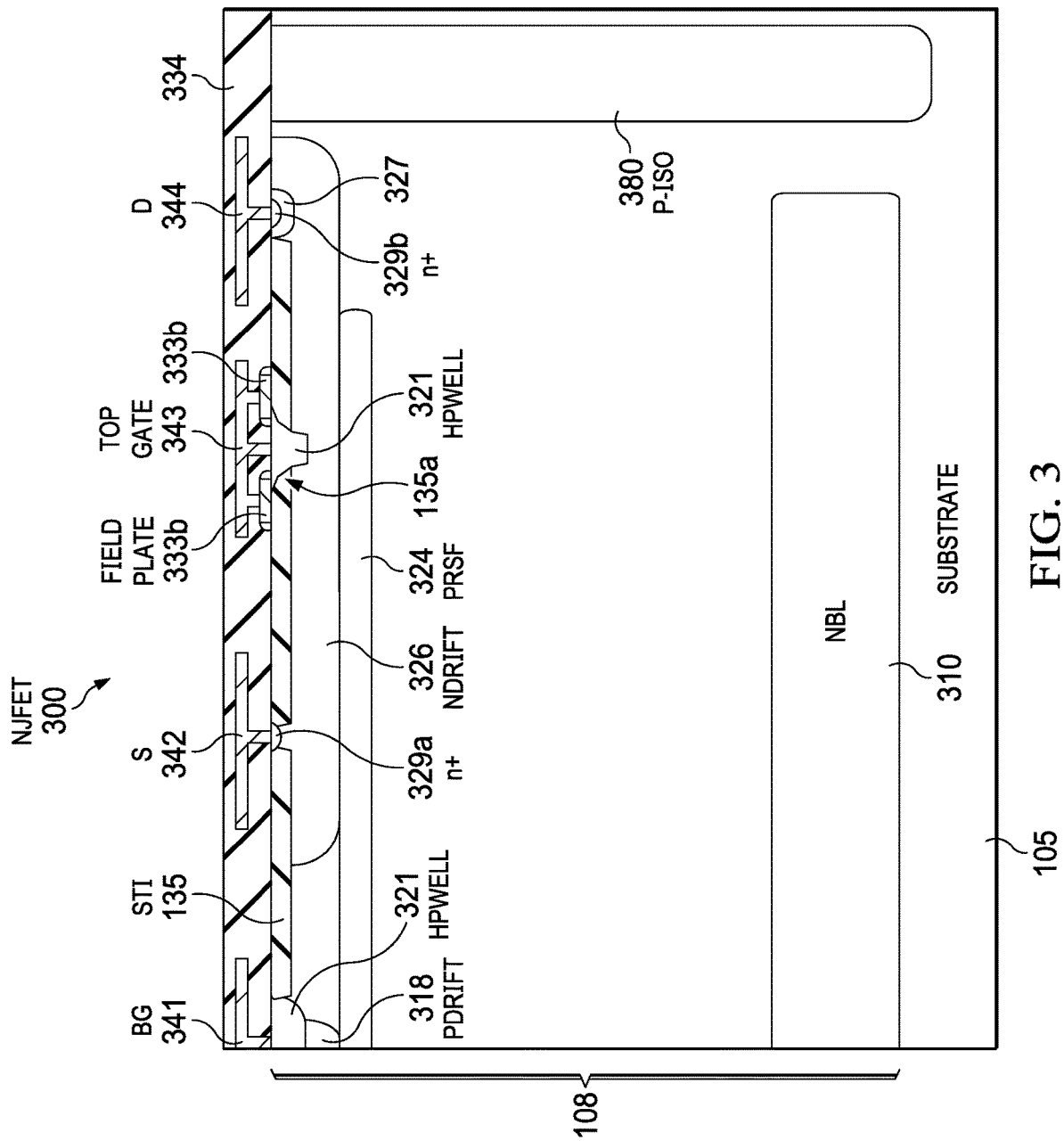
FIG. 3 is a cross sectional view of an example field-plated junction field effect transistor (JFET) shown as a split-gate device having STI with a tapered sidewall under a portion of the field plate and the top gate, according to an example aspect.

FIG. 3 is a cross sectional view of an example field-plated NJFET 300 shown as a split-gate device having STI 135 with a tapered sidewall 135a under a portion of the field plate 333b and the top gate 343, according to an example aspect. The NJFET 300 is shown including a pre-metal dielectric (PMD) layer 334, such as a tetraethoxysilane (TEOS) or High Density Plasma (HDP)-derived silicon oxide layer, and with etched contacts through the PMD layer 334 for the respective terminals of both the NJFET 300 and a patterned metal 1 layer that provides metal contacts. The metal contacts include back gate (BG) metal 341 to a p+ contact over the high voltage pwell (HPWELL) 321 to reach the p-type reduced surface field (PRSF) layer 324 as a BG through the PDRIFT region 318, S metal 342 to the n+ source 329a coupled to the NDRIFT region 326, top gate metal 343 to a p+ contact to the HPWELL 321, and D metal 344 to the n+ contact 329b to the HNWELL 327. An n-buried layer (NBL) 310 and a p-isolation region 380 are also shown.

Advantages of disclosed methods include creating tapered STI sidewalls for field-plated transistors without any additional mask levels, and thus no additional mask or extra process costs other than some typically inexpensive extra mask or reticle cost to include grayscale pattern areas. Disclosed methods can be used to tailor the sidewall profile of STI regions at specified locations for specific devices on the die, and the angles of the STI sidewall are also locally selectable based on device and design needs.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating a field-plated transistor, comprising:
    forming at least one body region in a semiconductor surface layer on a substrate;
    using a mask or a reticle having a grayscale pattern to form a patterned masking layer that includes a tapered sidewall having two slopes;
    etching with the patterned masking layer on the semiconductor surface layer to form at least one trench in the semiconductor surface layer having at least one tapered trench sidewall;
    filling the trench with at least one dielectric material then planarizing to form a first trench isolation region having at least a first tapered sidewall;
    forming a gate over the body region and a field plate including over at least a portion of the first tapered sidewall, and
    forming a source on one side of the field plate and a drain on an opposite side of the field plate.

2. The method of claim 1, wherein the first tapered sidewall has an average angle along its full length of 15 to 70 degrees relative to a bottom portion of the at least one trench.

3. The method of claim 1, wherein the mask or the reticle further comprises at least one non-grayscale pattern for the etching and the filling to further form second trench isolation regions that have an average angle along its full length of 75 and 90 degrees, and wherein the field-plated transistor is part of an integrated circuit (IC) having circuitry for realizing at least one circuit function having a plurality of transistors that utilizes the second trench isolation regions for isolation which are configured together with the field-plated transistor.

4. The method of claim 1, wherein the full length of the first tapered sidewall is tapered.

5. The method of claim 1, wherein the field-plated transistor comprises a metal oxide semiconductor (MOS) transistor.

6. The method of claim 1, wherein the MOS transistor comprises a LDMOS transistor having a source and a drain, and the gate that includes the field plate as a gate portion including over the first trench isolation region.

7. The method of claim 1, wherein the field-plated transistor comprises a junction field effect transistor (JFET).

8. The method of claim 1, wherein the gate comprises a polysilicon gate.

9. The method of claim 1, wherein the depth of the trench is 200nm to 900nm.

10. The method of claim 1, wherein the tapered sidewall has more than two slopes.

11. The method of claim 1, wherein the grayscale pattern includes opaque square pixels.

12. The method of claim 1, wherein the at least one tapered trench sidewall is a tapered STI sidewall.

13. The method of claim 1, wherein the at least one dielectric material is STI.

14. The method of claim 1, wherein the at least one dielectric material is a thermal oxide liner plus an STI fill.

15. The method of claim 1, wherein the first tapered sidewall has an average angle along its full length of 20 to 65 degrees relative to a bottom portion of the at least one trench.

* * * * *